United States Patent
Okura et al.

(10) Patent No.: US 9,777,377 B2
(45) Date of Patent: Oct. 3, 2017

(54) FILM FORMING METHOD AND FILM FORMING DEVICE

(71) Applicant: TOKYO ELECTRON LIMITED, Tokyo (JP)

(72) Inventors: Shigeyuki Okura, Nirasaki (JP); Hajime Yamanaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 101 days.

(21) Appl. No.: 14/411,525

(22) PCT Filed: Jun. 11, 2013

(86) PCT No.: PCT/JP2013/066015
§ 371 (c)(1),
(2) Date: Dec. 29, 2014

(87) PCT Pub. No.: WO2014/007028
PCT Pub. Date: Jan. 9, 2014

(65) Prior Publication Data
US 2015/0152557 A1 Jun. 4, 2015

(30) Foreign Application Priority Data
Jul. 4, 2012 (JP) .................................. 2012-150263

(51) Int. Cl.
*C23C 16/52* (2006.01)
*C23C 16/448* (2006.01)
(Continued)

(52) U.S. Cl.
CPC .......... *C23C 16/52* (2013.01); *C23C 16/4412* (2013.01); *C23C 16/4481* (2013.01); *C23C 16/45512* (2013.01); *C23C 16/45561* (2013.01)

(58) Field of Classification Search
None
See application file for complete search history.

(56) References Cited

U.S. PATENT DOCUMENTS

2003/0140857 A1* 7/2003 Umotoy .................. C23C 16/16
118/726
2006/0153995 A1* 7/2006 Narwankar ........... C23C 16/401
427/569
(Continued)

FOREIGN PATENT DOCUMENTS

| JP | 2001-107250 A | 4/2001 |
| JP | 2001-181839 A | 7/2001 |

(Continued)

OTHER PUBLICATIONS

International Search Report dated Aug. 28, 2013 corresponding to application No. PCT/JP2013/066015.

*Primary Examiner* — Joseph Miller, Jr.
(74) *Attorney, Agent, or Firm* — Nath, Goldberg & Meyer; Jerald L. Meyer (57) ABSTRACT

STEP 1 (Pressure increasing step) increases pressure within a raw material container to first pressure by supplying carrier gas to the inside of the raw material container by PCV. STEP 2 (Pressure decreasing step) decreases the pressure within the raw material container to second pressure by operating an exhaust device and discarding the raw material gas from a raw material gas supply pipe via an exhaust bypass pipe. STEP 3 (Stabilization step) stabilizes the vaporization efficiency for vaporizing the raw material inside the raw material container by operating the exhaust device and discarding the raw material gas while introducing the carrier gas into the raw material container. STEP 4 (Film forming step) supplies the raw material gas to the inside of the processing container via the raw material gas supply pipe and deposits a thin film on a wafer by CVD.

6 Claims, 7 Drawing Sheets

(51) Int. Cl.
*C23C 16/455* (2006.01)
*C23C 16/44* (2006.01)

(56) References Cited

U.S. PATENT DOCUMENTS

2007/0087579 A1* 4/2007 Kitayama ............ C23C 16/4405
438/778
2009/0325389 A1* 12/2009 Takebayashi ....... C23C 16/4408
438/758

FOREIGN PATENT DOCUMENTS

| | | |
|---|---|---|
| JP | 2004-207713 A | 7/2004 |
| JP | 2004-228526 A | 8/2004 |
| JP | 2006-052424 A | 2/2006 |
| JP | 2006-114803 A | 4/2006 |
| JP | 2011-003599 A | 1/2011 |
| JP | 2012-256762 A | 12/2012 |

* cited by examiner

FILM FORMING METHOD AND FILM FORMING DEVICE

TECHNICAL FIELD

The present disclosure relates to a film forming method and a film forming apparatus used for manufacturing, for example, a semiconductor device.

BACKGROUND

As a technology for forming various films on a substrate in the manufacturing process of a semiconductor device, a chemical vapor deposition (CVD) method or an atomic layer deposition (ALD) method has been used. In these film forming methods, a desired thin film is deposited on a substrate using a chemical reaction by introducing a raw material gas into a processing container that accommodates the substrate.

In the CVD method or the ALD method, a liquid or solid raw material (precursor) is vaporized to produce a raw material gas, and the produced raw material gas is supplied into a processing container. A bubbling method is known as one of the methods for supplying a raw material gas as above. In the bubbling method, the raw material is vaporized by feeding a carrier gas such as an inert gas into a raw material container filled with a volatile raw material. Since the bubbling method is in its nature configured to supply only the portions vaporizable by a self steam pressure to a processing container, it is advantageous in that a particle generation due to non-vaporized components is less as compared to a spray method. In addition, since the bubbling method can be implemented in a device configuration without a part, such as, a spray nozzle having an extremely throttled flow path, there is less concern for the occurrence of clogging in a raw material supply path.

The supply amount of the raw material in the bubbling method (the amount of a vaporized raw material gas in the gas supplied from a raw material container to a processing container. Hereinafter, referred to as a "pickup amount") $q_s$ can be theoretically obtained by the following equation:

$$q_s = k \times \left( \frac{P_s(T_b)}{P_b - P_s(T_b)} \right) \times q_c \quad \text{[Equation 1]}$$

In the equation, k means a number between 0 and 1, which represents the vaporization efficiency of the raw material, $P_s(T_b)$ means the vapor pressure of the raw material at temperature $T_b$ in the raw material container, $P_b$ means the pressure within the raw material container, and $q_c$ means the flow rate of a carrier gas.

In the equation above, it is usually difficult to realize the vaporization efficiency k=1 (100%), and k=0.3 to 0.6 (30 to 60%) or so for a low vapor pressure raw material. The pickup amount $q_s$ of such raw material varies according to, for example, the height of the liquid level in the raw material container, the flow rate $q_c$ of a carrier gas, etc. Specifically, the variation factors of the pickup amount $q_s$ include (1) changes in the vaporization efficiency k, (2), changes in the vapor pressure of the raw material due to changes in the remaining amount of the raw material or a raw material alteration in the raw material container, (3) changes in the vapor pressure of the raw material by the disturbance of a heating function, (4) changes in the conductance of a valve on the secondary side along the raw material container to the processing container (for example, changes in the pressure $P_b$ in the raw material container due to the pressure loss), and the like.

Further, from the equation above, it is understood that the pickup amount $q_s$ of the raw material also depends on the pressure $P_b$ within the raw material container in a conventional bubbling method where only the portion vaporizable by a self steam pressure is supplied to the processing container. Since the above pressure $P_b$ is almost equal to the pressure of the film forming process in the processing container, it is necessary to determine the process conditions in consideration of the influence on the pick-up amount $q_s$ of the raw material. This complicates the construction of process conditions.

With regard to the above problem, Patent Document 1 (Japanese laid-open publication No. 2006-52424) proposes, in the film forming apparatus with a bubbling method, a bubbling system where a mass flow controller (hereinafter, referred to as "MFC") is installed at a carrier gas supply pipe connected to a raw material container, and a mass flow meter (hereinafter, referred to as "MFM") is installed at a raw material gas supply pipe which supplies a vaporized raw material gas from a raw material container to a processing container. In this bubbling system, it is possible to monitor the raw material pickup amount $q_s$ in the raw material container from the difference between a measured flow rate value by the MFM and a set flow rate value of the MFC. Since the bubbling system proposed in Patent Document 1 allows monitoring of the pickup amount $q_s$ of the raw material, it is effective when a factor varying the pick-up amount $q_s$ occurs.

In the conventional bubbling method, the interior of a sealed raw material container is saturated under a condition where the processing for a substrate is not being conducted in a processing container (in a standby state). Accordingly, at the time of starting the flow of the vaporized raw material gas in order to process the next substrate, the vaporization efficiency k reaches approximately 1 (100%). However, the vaporization efficiency k converges toward a constant value over time as described above. On the other hand, in a CVD process, for example, in order to secure the uniformity of a film forming processing, it is required to stably feed a predetermined amount of raw material into the processing container over a predetermined time period. Therefore, the conventional film forming process employs a method of discarding the raw material gas by switching to an exhaust bypass line which bypasses the processing container, during the period from a point at which the flowing of the raw material gas is started to a point at which the vaporization efficiency k is stabilized. As such, it takes a considerable amount of time until the vaporization efficiency k is stabilized, thereby causing a reduced throughput or a loss of raw material.

SUMMARY

A film forming method of the present disclosure is conducted by using a film forming apparatus including: a processing container capable of being vacuumized; a mounting table, on which an object to be processed is mounted, installed in the processing container; an exhaust device configured to depressurize and exhaust an inside of the processing container; a raw material container having a gas inlet and a gas outlet and configured to accommodate a film forming raw material therein; a carrier gas supply unit configured to supply a carrier gas into the raw material container; a carrier gas supply path configured to connect the carrier gas supply unit and the raw material container and supply the carrier gas into the raw material container; a raw material gas supply path configured to connect the raw material container and the processing container and supply a raw material gas into the processing container; an exhaust bypass path branched from the raw material gas supply path and connected to the exhaust device without passing through the processing container; and a pressure adjusting means configured to adjust a pressure inside the raw material container. Further, the film forming method according to the present invention includes: increasing a pressure inside the raw material container to a first pressure $P_1$ by supplying the carrier gas into the raw material container by the pressure adjusting means, in a state where the gas outlet of the raw material container is closed; decreasing the pressure inside the raw material container to a second pressure $P_2$ by discarding the raw material gas inside the raw material container via the exhaust bypass path, in a state where the gas outlet is opened and an introduction of the carrier gas into the raw material container is blocked; stabilizing a vaporization efficiency of the raw material inside the raw material container while introducing the carrier gas into the raw material container and concurrently discarding the raw material gas via the exhaust bypass path; and forming a film by depositing a thin film on an object to be processed using CVD method by supplying the raw material gas into the processing container via the raw material gas supply path.

According to the film forming method of the present disclosure, the film forming apparatus may includes: a mass flow meter, a pressure control valve as the pressure adjusting means, and a plurality of valves in the carrier gas supply path, and a mass flow controller and a plurality of valves in the raw material gas supply path, wherein, in increasing a pressure inside the raw material container, the carrier gas may be supplied into the raw material container by the pressure control valve, and, in decreasing the pressure inside the raw material container, the raw material gas inside the raw material container may be discarded while being adjusted in a flow rate by the mass flow controller.

According to the film forming method of the present disclosure, in stabilizing a vaporization efficiency of the raw material inside the raw material container, the timing of a transition from stabilizing a vaporization efficiency of the raw material inside the raw material container to forming a film may be determined by monitoring a difference Fs–Fc between a measured flow rate Fs of the raw material gas in the mass flow controller and a measured flow rate Fc of the carrier gas in the mass flow meter.

According to the film forming method of the present disclosure, forming a film may be continued or stopped, or vaporization conditions of a raw material may be changed by monitoring a difference Fs–Fc between a measured flow rate Fs of the raw material gas in the mass flow controller and a measured flow rate Fc of the carrier gas in the mass flow meter.

According to the film forming method of the present disclosure, after forming a film is terminated for a certain object to be processed, while the processing container is in a standby state until a next object to be processed is processed, a film forming processing may be repeatedly performed for a plurality of objects to be processed by conducting increasing a pressure.

According to the film forming method of the present disclosure, if a partial pressure Ps of the raw material inside the raw material container in forming a film is in a range of 266 Pa to 400 Pa, a first pressure $P_1$ inside the raw material container when the pressure is increased in increasing a pressure may be in a range of 21331 Pa to 31997 Pa.

A film forming apparatus of the present disclosure includes: a processing container capable of being vacuumized, a mounting table, on which an object to be processed is mounted, installed in the processing container, an exhaust device configured to depressurize and exhaust an inside of the processing container, a raw material container having a gas inlet and a gas outlet and configured to accommodate a film forming raw material therein, a carrier gas supply unit configured to supply a carrier gas into the raw material container, a carrier gas supply path configured to connect the carrier gas supply unit and the raw material container and supply the carrier gas into the raw material container, a raw material gas supply path configured to connect the raw material container and the processing container and supply a raw material gas into the processing container, an exhaust bypass path branched from the raw material gas supply path and connected to the exhaust device without passing through the processing container, a pressure adjusting means configured to adjust a pressure inside the raw material container, and a control unit configured to control a film forming processing to be performed in the processing container. In addition, according to the film forming apparatus of the present disclosure, the film forming processing includes: increasing a pressure inside the raw material container to a first pressure $P_1$ by supplying the carrier gas into the raw material container using the pressure adjusting means, in a state where the gas outlet of the raw material container is closed, decreasing the pressure inside the raw material container to a second pressure $P_2$ by discarding the raw material gas inside the raw material container via the exhaust bypass path, in a state where the gas outlet is opened and an introduction of the carrier gas into the raw material container is blocked, stabilizing a vaporization efficiency of the raw material inside the raw material container while discarding the raw material gas via the exhaust bypass path and concurrently introducing the carrier gas into the raw material container, and forming a film by depositing a thin film on an object to be processed using CVD method by supplying the raw material gas into the processing container via the raw material gas supply path.

As such, according to the film forming apparatus and film forming method where a raw material supply is conducted by a bubbling method, the pressure inside the raw material container is increased before the vaporization efficiency k of the raw material is stabilized, thereby reducing the time taken until the vaporization efficiency k of the raw material is stabilized. As a result, it is possible to improve the throughput of the film forming process and concurrently suppress the loss of raw material due to the discarding thereof. Further, the uniformity of the film forming process among a plurality of objects to be processed, which are sequentially processed in the film forming apparatus, can be secured by rapidly stabilizing the vaporization efficiency k of the raw material.

DETAILED DESCRIPTION

Hereinafter, embodiments of the present disclosure will be described in detail with reference to the accompanying drawings.

[Overview of Film Forming Apparatus]

Figure 1:
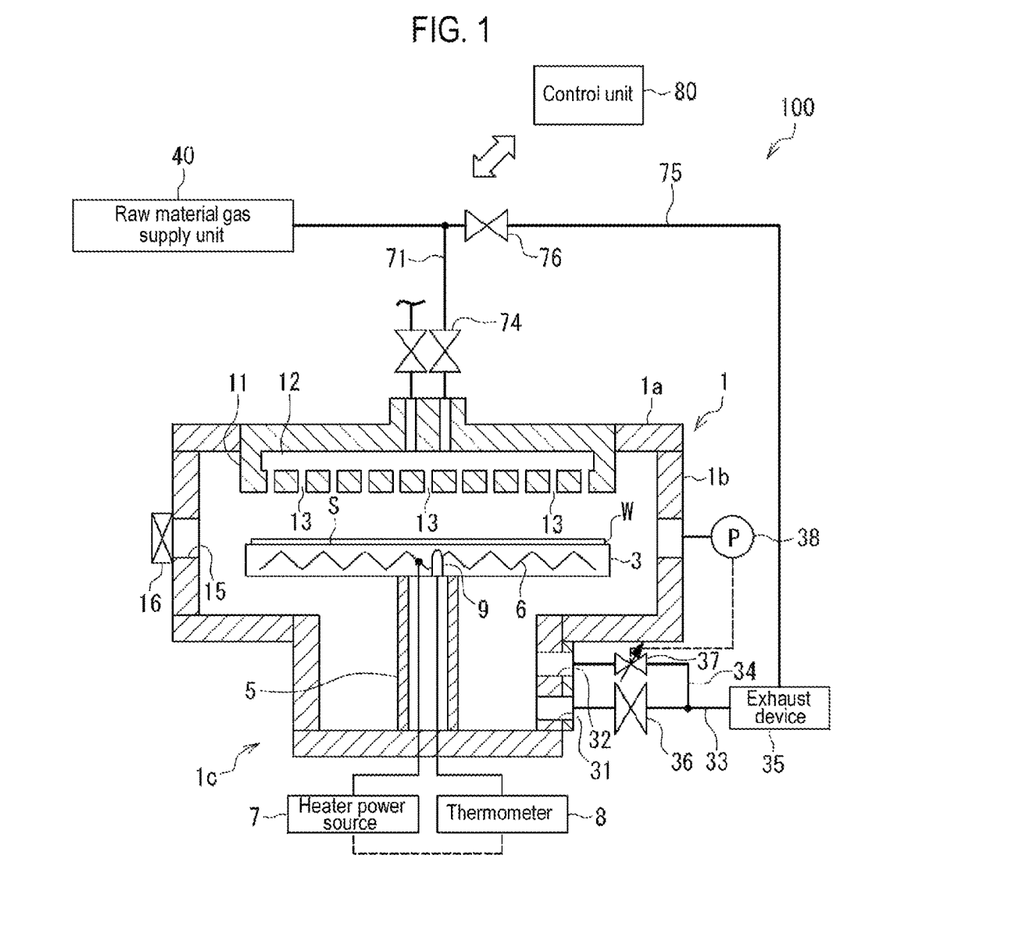
FIG. 1 is a sectional view showing a schematic configuration of a film forming apparatus that can be used in a film forming method according to a first embodiment of the present disclosure.
Figure 2:
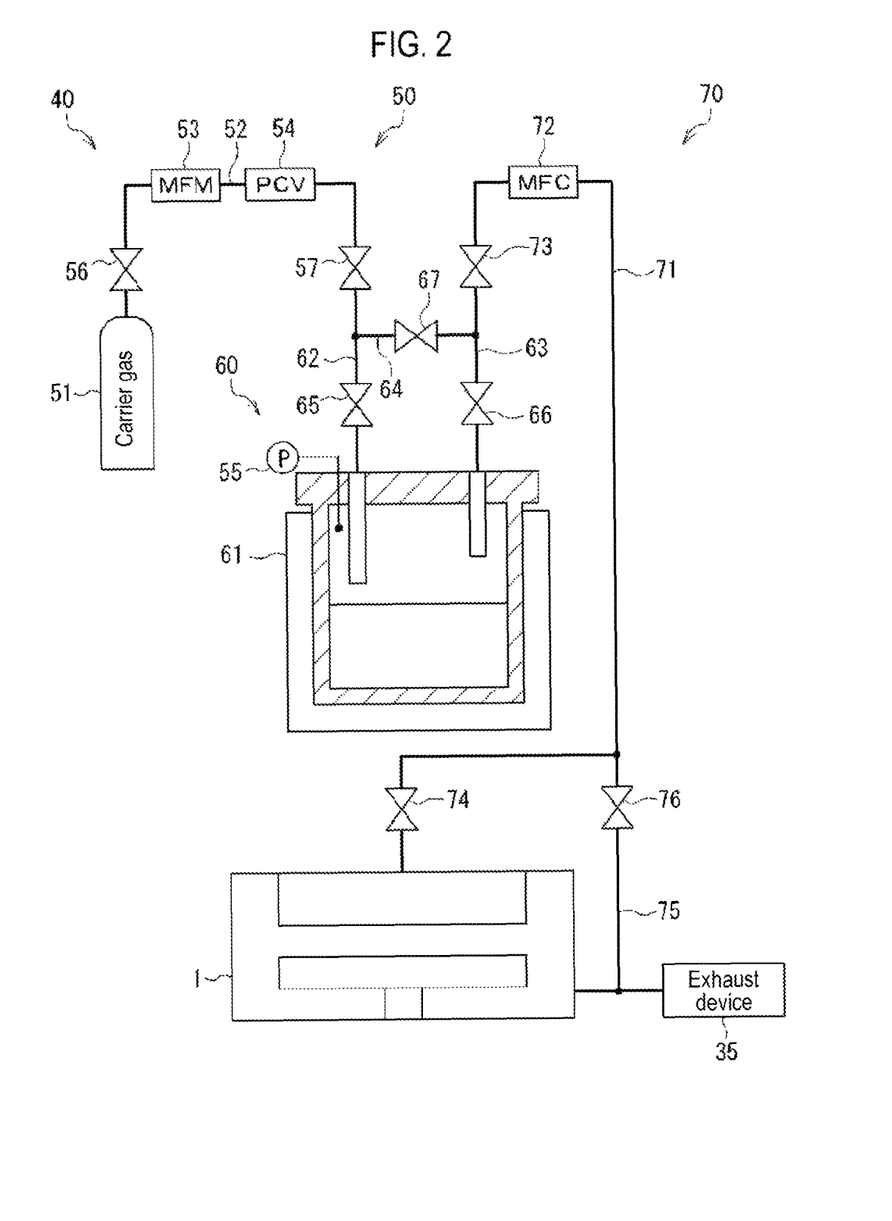
FIG. 2 is a view describing the configuration of a raw material gas supply unit of the film forming apparatus of FIG. 1.

First, the configuration example of a film forming apparatus according to a first embodiment of the present disclosure will be described. FIG. 1 shows a schematic configuration example of a film forming apparatus 100 according to the first embodiment of the present disclosure. FIG. 2 shows a configuration example of a raw material gas supply unit in the film forming apparatus 100. The film forming apparatus 100 includes a processing container 1 capable of being vacuumized, a stage 3 as a mounting table, installed inside the processing container 1, to mount thereon a semiconductor wafer (hereinafter, simply referred to as "wafer") W which is an object to be processed, an exhaust device 35 configured to depressurize and exhaust the inside of the processing container 1, and a raw material gas supply unit 40 configured to supply a raw material gas into the processing container 1. This film forming apparatus 100 is configured as a thermal CVD apparatus. In the film forming apparatus 100, it is possible to form various thin films on, for example, the wafer W.

The film forming apparatus 100 includes the processing container 1 having a substantially cylindrical shape and an airtight configuration. The processing container 1 includes a top plate 1a, a side wall 1b and a bottom wall 1c. The processing container 1 is formed of a material such as aluminum subjected to an alumite treatment (anode oxidation). Although not shown, an O-ring as a sealing member is disposed at a junction of each member constituting the processing container 1 in order to secure airtightness of the junction. A stage 3, which is a mounting table horizontally supporting the wafer W, is arranged in the processing container 1. The stage 3 is supported by a support member 5, which has a cylindrical shape.

In the stage 3, a heater 6 as a heating means for heating the wafer W is embedded. The heater 6 is a resistive heater to heat the wafer W to a predetermined temperature by using power supplied from a heater power source 7. Further, a thermocouple (TC) 9 and a thermometer 8 as temperature measuring means are disposed at the stage 3, whereby a temperature of the stage 3 may be measured in real time and fed back to the heater power source 7. Further, a heating means for heating the wafer W is not limited to a resistive heater and may include, for example, a lamp heater. Although not shown, a plurality of lift pins for supporting and moving up/down the wafer W are installed in the stage 3 so as to protrude from and retract into a substrate mounting surface S of the stage 3. The lift pins are configured to be vertically displaced by any suitable lifting mechanism. At an ascended position, the wafer W is transferred between the lift pins and a transfer apparatus (not shown).

A shower head 11 is provided at a top plate 1a of the processing container 1. The shower head 11 has a gas diffusion space 12 formed therein. A plurality of gas discharge holes 13 is formed in the bottom surface of the shower head 11. The gas diffusion space 12 communicates with the gas discharge holes 13. A plurality of gas supply pipes, such as a raw material gas supply pipe 71, communicating with the gas diffusion space 12 is connected to the central portion of the shower head 11.

In the side wall 1b of the processing container 1, an opening 15 for transferring the wafer W into/out of the processing container 1 is formed. Further, a gate valve 16 for opening/closing the opening 15 is provided.

In a side part of the bottom wall 1c of the processing container 1, a main exhaustion hole 31 and a secondary exhaust hole 32 are formed. This main exhaustion hole 31 is connected to an exhaust device 35 via a main exhaust pipe 33. Further, the secondary exhaust hole 32 is connected to the exhaust device 35 via a secondary exhaust pipe 34. A main exhaust valve 36 is provided at the main exhaust pipe 33. A pressure control valve 37 is provided at the secondary exhaust pipe 34. This pressure control valve 37 is controlled based on the measurement results of a pressure gauge 38 provided at the processing container 1. The exhaust device 35 includes, for example, a vacuum pump or an exhaustion detoxification device (not shown) and so on. Also, the exhaust device 35 is configured to vacuumize the processing container 1 by exhausting the inside of the processing container 1.

The film forming apparatus 100 includes a plurality of gas supply units. FIG. 1 representatively shows a raw material gas supply unit 40, which is configured to supply a raw material gas of the film forming processing. The film forming apparatus 100 may include as additional gas supply units, for example, a reactive gas supply unit for supplying a reactive gas that is reactive to the raw material gas, a purge gas supply unit for purging the inside of the processing container 1, a cleaning gas supply unit for cleaning the inside of the processing container 1, etc.

<Raw Material Gas Supply Unit>

FIG. 2 shows a detailed configuration of the raw material gas supply unit 40. The raw material gas supply unit 40 includes a carrier gas supply unit 50, a raw material container 60, and a vaporized raw material supply unit 70. In the following description, according to the flowing direction of the raw material gas and the carrier gas, the carrier gas supply unit 50 side is referred to as an "upstream side" and the exhaust device 35 side is referred to as a "downstream side."

(Carrier Gas Supply Unit)

The carrier gas supply unit 50 includes a carrier gas source 51 and a carrier gas supply pipe 52 as a carrier gas supply path for sending a carrier gas from the carrier gas source 51 to the raw material container 60. In this carrier gas supply pipe 52, a MFM (mass flow meter) 53 as a flow rate measuring means, a PCV (pressure control valve) 54 as a pressure adjusting means, and a plurality of opening and closing valves (valves 56, 57) are provided. The valve 56 is provided between the carrier gas source 51 and the MFM 53, and the valve 57 is provided between the PCV 54 and the raw material container 60.

(Raw Material Container)

The raw material container 60 accommodates a solid or liquid film forming raw material therein. The raw material container 60 is a pressure-resistant container and includes a pressure gauge 55. The PCV 54 is provided with a pressure gauge therein and is capable of adjusting the pressure inside the raw material container 60 by controlling a carrier gas supply amount from the carrier gas source 51 based on a value measured by the pressure gauge. The raw material container 60 includes a temperature adjusting apparatus (a cooler or a thermostat) 61 such as a jacket type heat exchanger, and is configured to maintain the raw material accommodated therein at a predetermined temperature.

Further, the raw material container 60 includes a gas introduction pipe 62 as a gas inlet, a gas discharge pipe 63 as a gas outlet, and a bypass pipe 64 used in a purge processing. The gas introduction pipe 62 is connected to the carrier gas supply pipe 52. The gas discharge pipe 63 is connected to a raw material gas supply pipe 71 to be described later. A valve 65 is provided in the gas introduction pipe 62. A valve 66 is installed in the gas discharge pipe 63. A valve 67 is installed in the bypass pipe 64. In addition, the valve 67 of the bypass pipe 64 is maintained in a closed state except when the purge processing is conducted.

(Vaporized Raw Material Supply Unit)

The vaporized raw material supply unit 70 includes the raw material gas supply pipe 71 as a raw material gas supply path for supplying a raw material gas to the processing container 1, an MFC (mass flow controller) 72 as a flow rate adjusting means provided in the middle of the raw material gas supply pipe 71, and a plurality of opening and closing valves (valves 73, 74). Although not shown, the MFC (mass flow controller) 72 includes a flow rate measurement unit and a flow rate control unit. In the flow rate control unit, a feedback control is carried out such that a measured flow rate measured by the flow rate measurement unit reaches a predetermined flow rate (set flow rate). If the temperature of the raw material gas is high, an MFC for high temperature, which can be used even at a temperature of, e.g., about 150 degrees C., may be used as the MFC 72. The valve 73 is provided between the raw material container 60 and the MFC 72. The valve 74 is provided between the MFC 72 and the processing container 1. In a portion of the raw material gas supply pipe 71, which is in the upstream side of at least the valve 74, a heater (not shown) is disposed to prevent condensation (solidification or liquefaction) of the raw material gas.

An exhaust bypass pipe 75, which is an exhaust bypass path communicating with the exhaust device 35, without communicating with the processing container 1, is connected to the raw material gas supply pipe 71 in the upstream side of the valve 74. In the middle of the exhaust bypass pipe 75, a valve 76 is provided. The exhaust bypass pipe 75 or the valve 76 may also be heated to a constant temperature by a heater not shown.

According to the configurations above, in the film forming apparatus 100, a carrier gas from the carrier gas source 51 may be supplied into the raw material container 60 via the carrier gas supply pipe 52 to contact a film forming raw material, which is maintained to be cooled or heated, and thereby to vaporize the film forming raw material from a solid or liquid state. In addition, a raw material gas including the carrier gas and the raw material is supplied to the gas diffusion space 12 of the shower head 11 via the raw material gas supply pipe 71, and discharged from the gas discharge holes 13 toward a wafer W disposed on the stage 3 inside the processing container 1.

<Control Unit>

Figure 3:
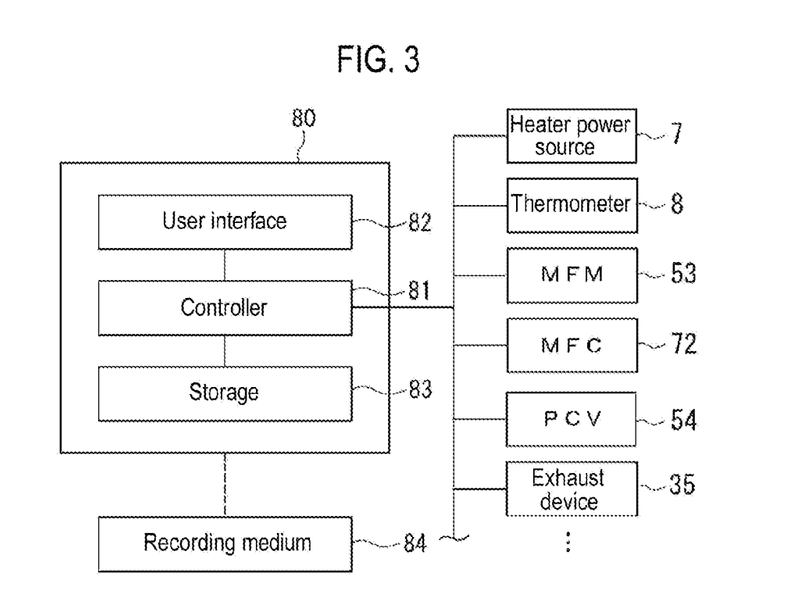
FIG. 3 is a block diagram illustrating a control system of the film forming apparatus of FIG. 1.

End devices (for example, the heater power source 7, the thermometer 8, the MFM 53, the PCV 54, the MFC 72, the exhaust device 35, the main exhaust valve 36, the pressure control valve 37, the valves 56 and 57, 65, 66, 67, 73, 74, 76 and so on) constituting the film forming apparatus 100 are connected to and controlled by a control unit 80. FIG. 3 shows a block diagram illustrating a control system in the film forming apparatus 100. The control unit 80 includes a controller 81 which is a computer including a CPU, a user interface 82, and a storage 83 connected to the controller 81. The user interface 82 may include a keyboard or a touch panel by which a process manager conducts input operations of commands to manage the film forming apparatus 100, a display for visually displaying operation situations of the film forming apparatus 100, etc. Control programs (software) to implement various kinds of processes performed in the film forming apparatus 100 under the control of the controller 81 or recipes recorded with processing condition data, etc. are preserved in the storage 83. As needed, any control program or any recipe is called from the storage 83 according to a command from the user interface 82 and executed by the controller 81, thereby conducting a desired process in the processing container 1 of the film forming apparatus 100 under the control of the controller 81.

The control program or the recipe of the processing condition data may be used by installing the control program or the recipe stored in a computer-readable recording medium into the storage 83. As a computer-readable recording medium 84, for example, a CD-ROM, a hard disk, a flexible disk, a flash memory, a DVD and the like may be used, but it is not limited thereto. In addition, the recipe may be used online by occasionally transferring the recipe from other devices via a dedicated line, for example.

In the forming apparatus 100 as configured above, a film forming processing is performed by a CVD method based on the control of the control unit 80. As one example for the procedures of the film forming processing, a wafer W is first carried into the processing container 1 through the opening 15 of the processing container 1 in a state where the gate valve 16 is opened, and is then transferred to lift pins (not shown) of the stage 3. Then, the lift pins are descended such that the wafer W is mounted on the stage 3. Subsequently, the gate valve 26 is closed and the exhaust device 35 is operated to vacuumize the inside of the processing container 1. In addition, the wafer W is heated to a predetermined temperature by the heater 6. Further, a film forming raw material gas is supplied to the shower head 11 from the raw material gas supply unit 40, and then supplied toward the wafer W from the gas discharge holes 13 of the shower head 11. Then, various kinds of thin films are formed on the surface of the wafer W by the CVD method. When the film forming processing is terminated, the wafer W where the film forming is completed is carried out from the processing container 1 in a sequence reverse to the above. Until the processing of the next wafer W is performed, the processing container 1 is in a standby state.

According to the film forming apparatus 100 of the present embodiment, since a pressure inside the raw material container 60 can be controlled to be constant by the PCV 54 disposed at the carrier gas supply pipe 52, it is possible to adjust the supply amount of the raw material gas to be constant without depending on the pressure of the film forming process performed inside the processing container 1.

Further, in the film forming apparatus 100, the MFM 53 is provided at the carrier gas supply pipe 52 in the upstream side of the raw material container 60, and the MFC 72 is provided at the raw material gas supply pipe 71 in the downstream side of the raw material container 60. Thus, from the measured flow rate Fs of the raw material gas at the MFC 72 and the measured flow rate Fc of the carrier gas at the MFM 53, the difference Fs−Fc is computed by the controller 81 of the control unit 80, and it can be understood as the pickup amount of the raw material. Therefore, in the film forming apparatus 100, it is possible to perform the film forming process while monitoring the raw material pickup amount qs during the film forming process.

[Film Forming Method]

Next, more detailed aspects of a film forming method performed in the film forming apparatus 100 will be described.

[First Embodiment]

Figure 4:
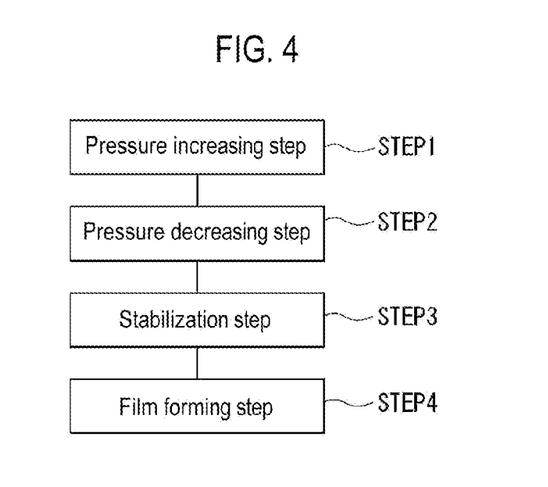
FIG. 4 is a flowchart showing an example of the procedure of a film forming method according to the first embodiment of the present disclosure.

FIG. 4 is a flowchart showing an example of the procedure of a film forming method according to the first embodiment of the present disclosure. This film forming method may include steps from STEP 1 to STEP 4 described below, according to the procedure described above. Further, STEP 1 to STEP 4 are performed in a state where the valve 67 of the bypass pipe 64 is closed.

(STEP 1)

STEP 1 is a pressure increasing step of increasing a pressure inside the raw material container 60. In this pressure increasing step, the amount of a carrier gas supplied into the raw material container 60 is controlled by the PCV 54 to increase the pressure inside the raw material container 60 to a pressure $P_1$, which is the first pressure. This step is performed in a state where the valve 66 of the gas discharge pipe 63 is closed, and valves 56 and 57 of the carrier gas supply pipe 52 and the valve 65 of the gas introduction pipe 62 are opened. Further, while the pressure inside the raw material container 60 is being controlled by the PCV 54, a carrier gas is supplied into the raw material container 60 from the carrier gas source 51 to increase the pressure inside the raw material container 60 to the pressure $P_1$. Herein, the pressure $P_1$ is a total pressure, which is the sum of the partial pressure of the carrier gas inside the raw material container 60 and the partial pressure (vapor pressure) of the raw material.

The pressure $P_1$ inside the raw material container 60 after increasing a pressure in the pressure increasing step of STEP 1 may be set to a range of 21331 Pa (160 Torr) to 31997 Pa (240 Torr), for example, if the partial pressure Ps of a raw material in the raw material container 60 in the film forming step of STEP 4 is in a range of 266 Pa (2 Torr) to 400 Pa (3 Torr). As such, by setting the pressure (total pressure) inside the raw material container 60 in the pressure increasing step of STEP 1 to be high, the partial pressure Ps of the raw material relatively decreases even when the inside of the raw material container 60 is saturated, thereby reducing the vaporization amount due to a self steam pressure of the raw material. As a result, the vaporization amount within the raw material container 60 can be made close to the vaporization amount in the film forming step of STEP 4, thereby significantly reducing the time taken until the vaporization efficiency k is stabilized in the stabilization step of STEP 3. When the partial pressure Ps is in a range of 266 Pa (2 Torr) to 400 Pa (3 Torr), if the pressure $P_1$ is significantly higher than the above-described range, the partial pressure of the raw material, after the pressure increase relatively, decreases excessively, which is lower than the partial pressure Ps of the raw material in the film forming step of STEP 4. Therefore, it takes time for a pressure adjustment. If the pressure $P_1$ is too lower than the range above, it is difficult to obtain the effect of reducing the time taken until the vaporization efficiency k is stabilized in STEP 3. As such, the pressure $P_1$ may be set in consideration of the partial pressure Ps of the raw material inside the raw material container 60 in the film forming step of STEP 4.

In the pressure increasing step of STEP 1, when the pressure inside the raw material container 60 increases to the pressure $P_1$, the valve 65 of the gas introduction pipe 62 is closed to maintain the pressure $P_1$ inside the raw material container 60.

(STEP 2)

STEP 2 is a pressure decreasing step of decreasing the pressure inside the raw material container 60. In the pressure decreasing step, the valve 66 of the gas discharge pipe 63 is opened in a state where the valve 65 of the gas introduction pipe 62 is closed after the termination of STEP 1. Then, the exhaust device 35 is operated to discard the raw material gas via the exhaust bypass pipe 75 from the raw material gas supply pipe 71, thereby decreasing the pressure inside the raw material container 60 from the pressure $P_1$ to the pressure $P_2$, which is the second pressure. At this time, while a flow rate control is being performed by the MFC 72 provided at the raw material gas supply pipe 71, the pressure inside the raw material container 60 is decreased. Further, the valves 56 and 57 of the carrier gas supply pipe 52 may be left opened.

In the pressure decreasing step of STEP 2, the valve 66 of the gas discharge pipe 63 is opened in a state where the valve 65 of the gas introduction pipe 62 is closed. Further, the valve 73 of the raw material gas supply pipe 71 is opened, the valve 74 is closed, and instead the valve 76 of the exhaust bypass pipe 75 is opened. In other words, the raw material gas which fills the inside of the raw material container 60 in STEP 1 is discarded from the exhaust device 35 while bypassing the processing container 1, thereby reducing a pressure inside the raw material container 60 to the pressure $P_2$. Herein, the pressure $P_2$ is a total pressure, which is the sum of the partial pressure of the carrier gas inside the raw material container 60 and the partial pressure (vapor pressure) of the raw material. The pressure $P_2$ may be set to be identical to a total pressure inside the raw material container 60 in the film forming step of STEP 4. Further, the relation among the pressure $P_1$, pressure $P_2$ and the partial pressure Ps of the raw material within the raw material container 60 in the film forming step of STEP 4 is $P_1 > P_2 > Ps$. Herein, the relationship between the pressure $P_1$ and the partial pressure Ps is the same as the example above, and the relationship between the pressure $P_1$ and the pressure $P_2$ is that, for example, the pressure $P_1$ may be about 1.5 to 50 times the pressure $P_2$.

(STEP 3)

STEP 3 is a stabilization step of stabilizing the vaporization efficiency k of the raw material inside the raw material container 60. In the stabilization step, from the state of STEP 2, the valve 65 of the gas introduction pipe 62 is opened to introduce a carrier gas into the raw material container 60 from the carrier gas source 51, and concurrently the exhaust device 35 is operated to discard the raw material gas via the exhaust bypass pipe 75 from the raw material gas supply pipe 71. The introduction of the carrier gas into the raw material container 60 is carried out as the pressure inside the raw material container 60 is controlled by the PCV 54, thereby stabilizing the vaporization efficiency k of the raw material inside the raw material container 60.

The stabilization step of STEP 3 is performed in a state where the valves 56 and 57 of the carrier gas supply pipe 52 are opened, the valve 73 of the raw material gas supply pipe 71 is opened, the valve 74 is closed, and the valve 76 of the exhaust bypass pipe 75 is opened. In the CVD process performed in the film forming apparatus 100, it is required that the supply amount of the raw material, which is vaporized in the raw material container 60 and supplied into the processing container 1 along with the carrier gas, is constant during the CVD process. Accordingly, in STEP 3, until the vaporization efficiency k is stabilized, while the carrier gas is being supplied into the raw material container 60, the generated raw material gas is discarded through the exhaust bypass pipe 75 bypassing the processing container 1. In a CVD process using a typical bubbling system, the vaporization efficiency k is in a range of, for example, 0.3 to 0.6 (30 to 60%). Further, STEP 3 is performed in a state where the pressure within raw material container 60 is maintained at the second pressure $P_2$ by controlling the amount of the carrier gas supplied from the carrier gas source 51 by the PCV 54.

The time taken until the vaporization efficiency k is stabilized in a target film forming condition can be experimentally confirmed in advance, and the length of the stabilization step of STEP 3 (that is, the end point of STEP 3) can be set based on the time. The film forming condition may include, for example, a type of raw material, the processing pressure, a supply flow rate of the raw material gas, a flow rate of the carrier gas, the temperature inside the raw material container 60, etc.

Further, the wafer W can be transferred into the processing container 1 during the period from STEP 1 to STEP 3 above. In addition, in order to improve the throughput, the process time of STEP 2 and the process time of STEP 3 may overlap each other.

(STEP 4)

The film forming step of STEP 4, which follows STEP 3, is a step of supplying the raw material gas into the processing container 1 via the raw material gas supply pipe 71 and depositing a thin film on a wafer W by the CVD method. In STEP 4, from the state of STEP 3, the valve 74 of the raw material gas supply pipe 71 is opened and the valve 76 of the exhaust bypass pipe 75 is closed. Thus, an exhaust mode where the raw material gas is exhausted via the exhaust bypass pipe 75 is switched to a film forming mode where the raw material gas is supplied into the processing container 1. In other words, the film forming step is performed in a state where the valves 56 and 57 of the carrier gas supply pipe 52 are opened, the valve 65 of the gas introduction pipe 62 is opened, the valve 66 of the gas discharge pipe 63 is opened, the valves 73 and 74 of the raw material gas supply pipe 71 are opened, and the valve 76 of the exhaust bypass pipe 75 is closed. Further, in the film forming step, since the pressure inside the raw material container 60 can be controlled to be constant by the PCV 54 disposed at the carrier gas supply pipe 52, it is possible to adjust the supply amount of the raw material gas to be constant without depending on the pressure of the film forming process performed inside the processing container 1.

The thin film formed on the wafer W in the film forming step of STEP 4 may include, for example, an insulating film such as $SiO_2$, a high dielectric constant film such as Hf-based film, a metal film such as Al, Ti, or Ru, but is not particularly limited thereto. Inorganic material, organic metal material or the like, which becomes the raw material of the thin film, is kept in the raw material container 60, and the CVD process can be performed under a predetermined condition.

In STEP 4, the film forming conditions including the type of the raw material, the processing pressure, the supply flow rate of the raw material gas, the flow rate of the carrier gas, the temperature of the raw material container 60, etc. are appropriately set according to a film forming purpose, and may be stored as recipes in the storage 83 of the control unit 80. Then, the controller 81 reads the recipes and transmits a control signal to each end device of the film forming apparatus 100, thereby performing the film forming processing under desired conditions in the film forming apparatus 100.

After the film forming processing is terminated, the valve 74 is closed, the valve 76 is opened, and the supply of the raw material gas is switched from a film forming mode to an exhaust mode. Thus, the gas within the raw material gas supply pipe 71 bypasses the processing container 1 and is exhausted via the exhaust bypass pipe 75.

According to the film forming method of the present embodiment, the steps of STEP 1 to STEP 4 can be performed repeatedly by changing the wafer W to be processed. In this case, after the film forming step (STEP 4) for the previous wafer W is terminated, while the processing container 1 is in a standby state, the processing of STEP 1 can be performed in preparation for the processing of the next wafer W.

Further, in addition to the steps of STEP 1 to STEP 4, the film forming method of the present embodiment may include any other steps, for example, a step of flowing a purge gas into the processing container 1 or the pipes, or a step of vacuumizing the inside of the processing container 1 or the inside of the pipes.

Figure 5:
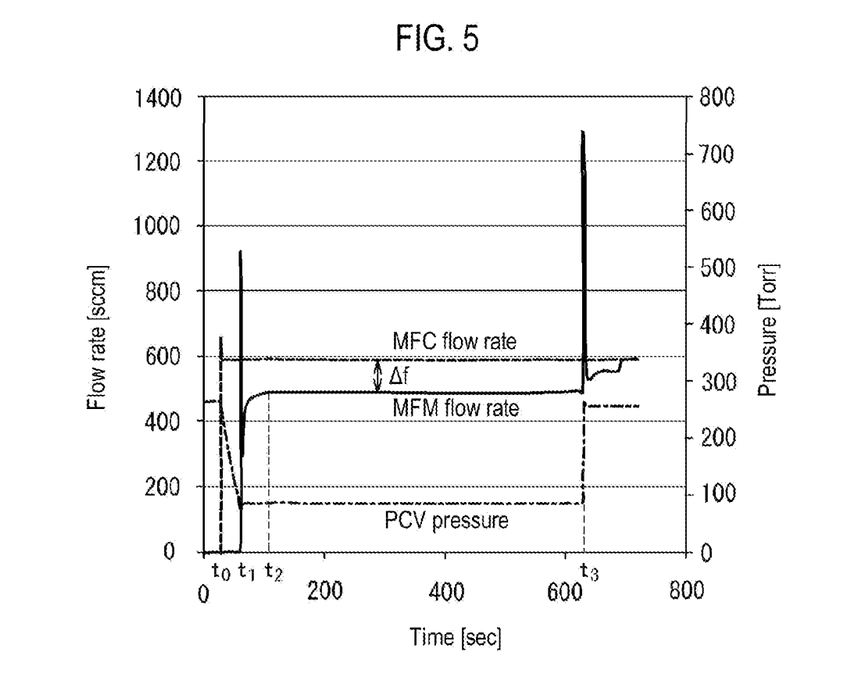
FIG. 5 is a graph showing experimental results of stabilizing the vaporization efficiency of the raw material by the method according to the first embodiment of the present disclosure.
Figure 6:
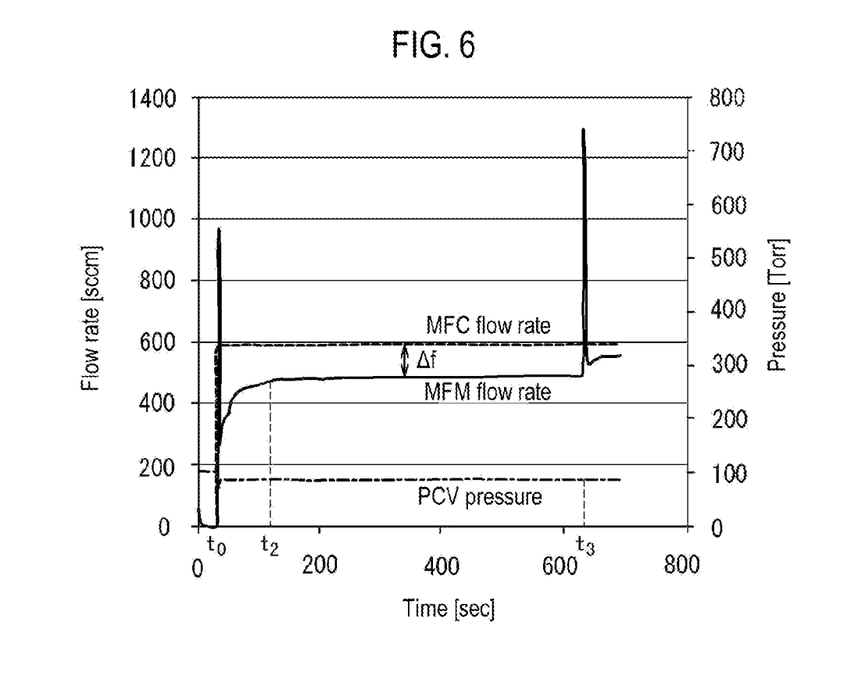
FIG. 6 is a graph showing experimental results of stabilizing the vaporization efficiency of the raw material by a conventional method.

Next, results of experiments forming the basis of the present disclosure will be described with reference to FIG. 5 and FIG. 6. FIG. 5 is a graph showing a measured flow rate at the MFC 72, a measured flow rate at the MFM 53, and a pressure inside the raw material container 60 by the PCV 54 over time when the film forming processing is performed according to the steps of STEP 1 to STEP 4 in the film forming apparatus 100. Further, FIG. 6 is a graph showing, as a comparative example, a measured flow rate at the MFC 72, a measured flow rate at the MFM 53, and a pressure inside the raw material container 60 by the PCV 54 over time when the film forming processing is performed according to a conventional method where only STEP 3 and STEP 4 are performed without performing the steps of STEP 1 and STEP 2 in the film forming apparatus 100. In FIG. 5 and FIG. 6 the horizontal axis represents time [sec], the vertical axis on the left side represents flow rates [sccm (mL/min)] of the MFC 72 and the MFM 53, and the vertical axis on the right side represents the pressure [Torr] of the raw material container 60 by the PCV 54. In FIG. 5 and FIG. 6, a difference (Δf) between the flow rate of the MFC 72 and the flow rate of the MFM 53 corresponds to a pickup amount of the raw material conveyed by the carrier gas.

In this experiment, an organic metallic compound gas is used as the raw material, and a nitrogen ($N_2$) gas is used as the carrier gas. In FIG. 5, the set pressure (=the total pressure inside the raw material container 60) of the PCV 54 is 34658 Pa (260 Torr) before the raw material flow is started, 13330 Pa (100 Torr) during the raw material flow (the film forming step), and 34658 Pa (260 Torr) after the raw material flow. In FIG. 6, the set pressure (=the total pressure inside the raw material container 60) of the PCV 54 is 13330 Pa (100 Torr) before the raw material flow is started, 13330 Pa (100 Torr)

during the raw material flow (the film forming step), and 13330 Pa (100 Torr) after the raw material flow.

First, in FIG. 5, if the flow initiation of the MFC 72 is set as a starting point $t_0$, the interval from $t_0$ to $t_1$ corresponds to STEP 2 described above. During the interval from $t_0$ to $t_1$, the set pressure (=the total pressure inside the raw material container 60) of the PCV 54 decreases from 34658 Pa (260 Torr) to 13330 Pa (100 Torr) while the flow rate is being controlled by the MFC 72. Then, the supply of the carrier gas is initiated at $t_1$. The interval from $t_1$ to $t_2$ is the time taken until the pickup amount Δf of the raw material from the raw material container 60 is stabilized, and the interval from $t_1$ to $t_2$ corresponds to STEP 3 described above. In the interval from $t_2$ to $t_3$, the pickup amount Δf of the raw material is in a stabilized state (i.e., the vaporization efficiency k is in a stabilized state), and the film forming step of STEP 4 is performed during the interval from $t_2$ to $t_3$. After $t_3$, the film forming step of STEP 4 is terminated, and the processing container 1 is in a standby state until the processing of a next wafer W is initiated. At $t_3$, the set pressure (=the total pressure inside the raw material container 60) of the PCV 54 is increased from 13330 Pa (100 Torr) to 34658 Pa (260 Torr) identical to the initial value, which corresponds to the pressure increasing step of STEP 1 described above.

Meanwhile, in FIG. 6, if the flow initiation of the MFC 72 is set as a starting point $t_0$, the supply of the carrier gas is simultaneously initiated at this $t_0$. In this case, since there is no pressure decreasing step that corresponds to STEP 2 described above, the interval from $t_0$ to $t_2$ is the time taken until the pickup amount Δf of the raw material from the raw material container 60 is stabilized, and the interval from $t_0$ to $t_2$ corresponds to STEP 3 described above. Then, in the interval from $t_2$ to $t_3$, the pickup amount Δf of the raw material is in a stabilized state (i.e., the efficiency k is in a stabilized state) and the film forming step of STEP 4 described above is performed. After $t_3$, the film forming step of STEP 4 is terminated, and the processing container 1 is in a standby state until the processing of a next wafer W is initiated.

In the procedure of FIG. 6 that does not include STEP 1 and STEP 2 described above, the time from $t_0$ to $t_2$ for the step of stabilizing the pickup amount Δf of the raw material from the raw material container 60, which corresponds to STEP 3, is about 85 seconds. On the contrary, in the procedure of FIG. 5 including the steps of STEP 1 to STEP 4 described above, the time from $t_1$ to $t_2$ for the step of stabilizing the pickup amount Δf of the raw material from the raw material container 60, which corresponds to STEP 3, is substantially reduced to about 28 seconds. The time from $t_1$ to $t_2$ has been sufficiently reduced even if the time from $t_0$ to $t_1$ (about 30 seconds) required for the pressure decreasing step (STEP 2) is added. In addition, since the time from $t_0$ to $t_1$ required for the pressure decreasing step (STEP 2) depends on the maximum flow rate (full scale) of the MFC 72, it can be further reduced by scaling up the MFC 72. Thus, by performing the processing of STEP 1 to STEP 4 described above, the time $t_1$ to $t_2$ for the step of stabilizing the pickup amount Δf of the raw material from the raw material container 60 may be reduced, improving the throughput of the film forming process and concurrently suppressing the loss of raw material due to the discarding thereof. Further, the uniformity of the film forming process among a plurality of wafers W, which are sequentially processed in the film forming apparatus 100, can be secured by rapidly stabilizing the vaporization efficiency k of the raw material. Therefore, it is possible to improve the reliability of the film forming process performed by the film forming apparatus 100.

[Second Embodiment]

Next, a film forming method of the second embodiment according to the present disclosure performed in the film forming apparatus 100 will be described with reference to FIG. 7. In the film forming method of the first embodiment, the film forming processing was performed according to the procedure of STEP1 to STEP4 described above (see FIG. 4). The present embodiment also performs the film forming processing basically according to the procedure of STEP1 to STEP4 described above. However, in the second embodiment, during STEP3, the termination of the step of stabilizing the vaporization efficiency k of the raw material is determined by a method different from the first embodiment. Hereinafter, descriptions will be made focusing on the differences from the first embodiment.

Since the substances of STEP 1, STEP 2, and STEP 4 in the film forming method of the present embodiment are the same as those in the first embodiment, descriptions thereof are omitted, and STEP 3 will be described.

(STEP 3)

In the present embodiment, the stabilization step of STEP 3 is a step of stabilizing the vaporization efficiency k of the raw material inside the raw material container 60. The vaporization efficiency k of the raw material inside the raw material container 60 is stabilized while, from the state of STEP 2, the valve 65 of the gas introduction pipe 62 is opened to introduce a carrier gas from the carrier gas source 51 into the raw material container 60, and the exhaust device 35 is concurrently operated to discard the raw material gas via the exhaust bypass pipe 75 from the raw material gas supply pipe 71. In the first embodiment, the time taken until the vaporization efficiency k is stabilized in target film forming conditions (the type of the raw material, the processing pressure, the supply flow rate of the raw material gas, the flow rate of the carrier gas, the temperature inside the raw material container 60, etc.) is experimentally confirmed, and the length of the stabilization step of STEP 3 (that is, the end point of STEP 3) is set based on the time described above. In the present embodiment, the end point of STEP 3 is detected by monitoring, in the control unit 80, the difference Fs−Fc between a measured flow rate Fs of the raw material gas of the MFC 72 and a measured flow rate Fc of the carrier gas of the MFM 53.

Figure 7:
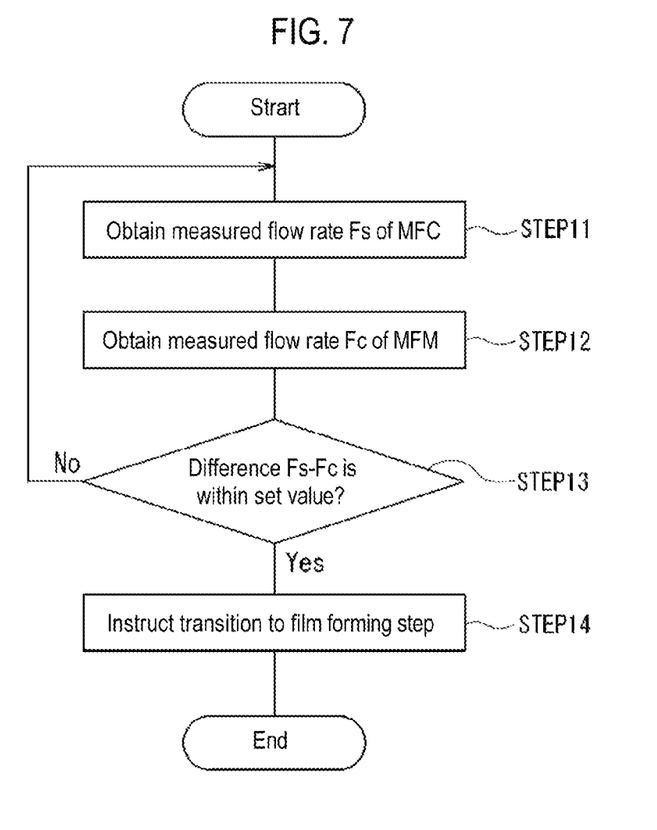
FIG. 7 is a flowchart showing an example of the procedure of a film forming method according to a second embodiment of the present disclosure.

The detection of the end point of STEP 3 can be made, for example, according to the procedure of STEP 11 to STEP 14 shown in FIG. 7. First, in STEP 11, the controller 81 of the control unit 80 obtains the measured flow rate Fs of the raw material gas of the MFC 72 as numerical data. Then, in STEP 12, the controller 81 of the control unit 80 obtains the measured flow rate Fc of the carrier gas of the MFM 53 as numerical data.

Then, in STEP 13, in the controller 81 of the control unit 80, the difference Fs−Fc between the measured flow rate Fs of the raw material gas of the MFC 72 and the measured flow rate Fc of the carrier gas of the MFM 53 is computed and compared with a predetermined set value. The set value is set based on the vaporization efficiency k in various conditions of a desired film forming process performed in the film forming apparatus 100, and it can be set with a range having a certain width. In the stabilization step, over time, the vaporization efficiency k converges to a constant value, and therefore the difference Fs−Fc also approaches a constant value. Therefore, when the difference Fs−Fc falls within the range of the set value, it can be determined that the vaporization efficiency k is stabilized (in other words, the end point of STEP 3).

In STEP 13, if it is determined that the difference Fs–Fc falls within the range of the set value ("YES"), the controller 81 of the control unit 80 terminates the stabilization step of STEP 3 in STEP 14, and directs a transition to the film forming step of STEP 4. Specifically, control signals for opening/closing valves are transmitted from the control unit 80, and the valve 74 of the raw material gas supply pipe 71 is switched from a close state to an open state, and the valve 76 of the exhaust bypass pipe 75 is changed from an open state to a close state, respectively. Thereafter, as with the first embodiment, the film forming step of STEP 4 is performed.

Further, in STEP 13, if it is determined that the difference Fs–Fc does not fall within the predetermined range of the set value ("NO"), the process returns to STEP 11, where the controller 81 of the control unit 80 refers to the measured flow rate Fs of the raw material gas of the MFC 72. Then, the process goes to STEP 12, where the controller 81 of the control unit 80 refers to the measured flow rate Fc of the carrier gas of the MFM 53. Thus, the measured flow rates Fs and Fc are obtained as new numerical data, respectively. Then, until it is determined the difference Fs–Fc falls within the range of the set value ("YES") in STEP 13 described above, the processing from STEP 11 to STEP 13 is repeated during a predetermined time interval, and a change in the difference Fs–Fc is monitored.

In the film forming method of the first embodiment, according to desired film forming conditions (the kind of raw material, the processing pressure, the supply flow rate of the raw material gas, the flow rate of the carrier gas, the temperature inside the raw material container 60, etc.), the process time of STEP 3 is set in advance, thereby carrying out a transition from STEP 3 to STEP 4 (switching of the valves). In order to realize a stable CVD process with this method, it is necessary to set the process time of STEP3 by adding a predetermined margin to the minimal time required to stabilize the vaporization efficiency k. However, in principle, it is better to have a shorter process time of STEP 3. Therefore, in the film forming method of the present embodiment, by monitoring the difference Fs–Fc, the end point of STEP 3 is detected nearly in real-time, thereby minimizing the process time of STEP 3.

Further, if the process time of STEP 3 is defined without any variation, even when the vaporization efficiency k is not stabilized because the pickup of the raw materials is not performed normally for some reason, the process is automatically transited to the film forming step of STEP 4 over time. Therefore, in this case, there is a possibility that a film forming failure may be caused. On the contrary, in the film forming method of the present embodiment, the transition to STEP 4 may be stopped when the vaporization efficiency k is not stabilized, by monitoring the difference Fs–Fc, thereby preventing any occurrence of the film forming failure. For example, an upper limit of the process time of STEP 3 may be set, and, even when the upper limit of the process time is reached, the process may be stopped without going through the transition to the film forming step of STEP 4 if the difference Fs–Fc does not fall within the range of the set value. Further, the control unit 80 may include a counter (not shown), which adds up the number of repetitions from STEP 11 to STEP 13 of FIG. 7 as a count value, and, if the count value reaches a predetermined number of times, the process may be determined as abnormal and stopped without going through the transition to the film forming step of STEP 4.

Further, in the present embodiment, instead of using the measured flow rate Fs of the raw material gas at the MFC 72, a set flow rate Fs' of the raw material gas at the MFC 72 may be used. In this case, if it is determined that the difference Fs'–Fc does not fall within the predetermined range of the set value ("NO") in STEP 13, the process only needs to return to STEP 12 and re-acquire the measured flow rate Fc of the carrier gas of the MFM 53 on and after the second time of the iterations, since the set flow rate Fs' of the material gas of the MFC 72 obtained in STEP 11 is a fixed value.

As described above, according to the film forming method of the second embodiment, the time taken until the pickup amount Δf (in other words, the vaporization efficiency k) of the raw material from the raw material container 60 is stabilized may be reduced by performing the processing of STEP 1 to STEP 4 described above, thereby improving the throughput of the film forming process. Further, as shown in FIG. 7, the end point of STEP 3 can be detected by monitoring the difference Fs–Fc (or the difference Fs'–Fc), thus minimizing the process time of STEP 3. Further, when the vaporization efficiency k is not stabilized, the transition to STEP 4 may be stopped, thereby preventing the occurrence of the film forming failure. Therefore, it is possible to improve the reliability of the film forming process performed by the film forming apparatus 100.

Other configurations and effects of the present embodiment are the same as those of the first embodiment.

[Third Embodiment]

Next, a film forming method of the third embodiment according to the present disclosure performed in the film forming apparatus 100 will be described with reference to FIG. 8. In the film forming method of the first embodiment, the film forming processing was performed according to the procedure of STEP1 to STEP4 described above (see FIG. 4). The present embodiment also performs the film forming processing basically according to the procedure of STEP1 to STEP4 described above. However, in the third embodiment, during the film forming step of STEP 4, the film forming processing is performed while the difference Fs–Fc is being monitored by the control unit 80. Hereinafter, descriptions will be made focusing on the differences from the first embodiment.

Since the substances of STEP 1, STEP 2, and STEP 3 in the film forming method of the present embodiment are the same as those in the first embodiment, descriptions thereof are omitted, and STEP 4 will be described.

(STEP 4)

In the present embodiment, the film forming step of STEP 4 is a step of supplying the raw material gas into the processing container 1 via the raw material gas supply pipe 71 and depositing a thin film on a wafer W by a CVD method. In STEP 4, from the state of STEP 3, the valve 74 of the raw material gas supply pipe 71 is opened and the valve 76 of the exhaust bypass pipe 75 is closed. Accordingly, an exhaust mode where the raw material gas is exhausted via the exhaust bypass pipe 75 is switched to a film forming mode where the raw material gas is supplied into the processing container 1. This step is performed in a state where the valves 56 and 57 of the carrier gas supply pipe 52 is opened, the valve 65 of the gas introduction pipe 62 is opened, the valve 66 of the gas discharge pipe 63 is opened, the valves 73 and 74 of the raw material gas supply pipe 71 is opened, and the valve 76 of the exhaust bypass pipe 75 is closed.

The film forming step of STEP 4 is performed under the control of the controller 81 of the control unit 80 based on a predetermined recipe. In the present embodiment, during the film forming step of STEP 4, the film forming step is performed while the difference Fs–Fc between the measured flow rate Fs of the raw material gas of the MFC 72 and the measured flow rate Fc of the carrier gas of the MFM 53 is being monitored by the control unit 80 to determine whether to continue the processing or not.

Figure 8:
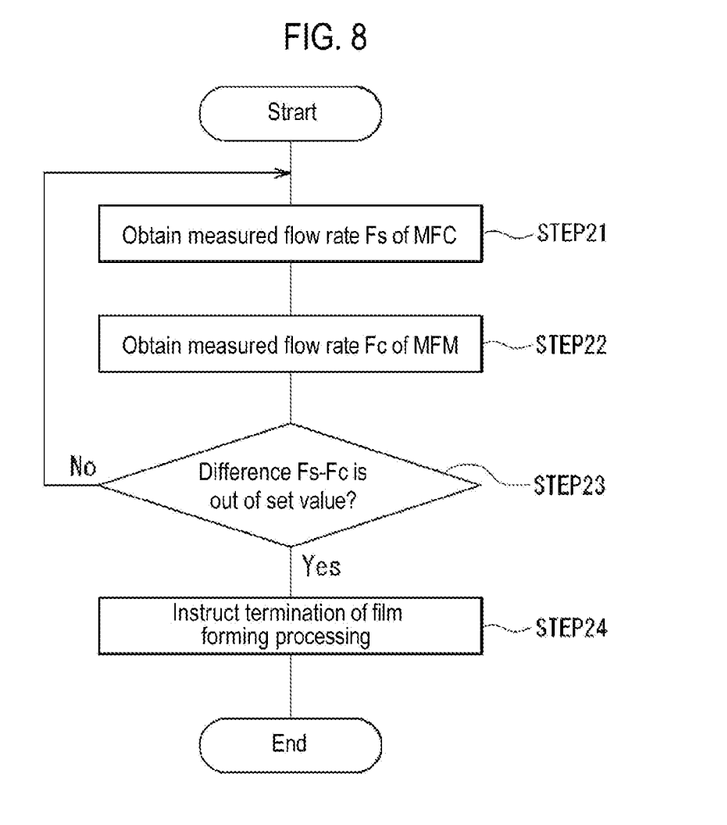
FIG. 8 is a flowchart showing an example of the procedure of a film forming method according to a third embodiment of the present disclosure.

In the film forming step of STEP 4, the determination of whether to continue the processing or not can be made according to the procedure of STEP 21 to STEP 24 shown in FIG. 8. First, in STEP 21, the controller 81 of the control unit 80 obtains the measured flow rate Fs of the raw material gas of the MFC 72 as numerical data. Then, in STEP 22, the controller 81 of the control unit 80 obtains the measured flow rate Fc of the carrier gas of the MFM 53 as numerical data.

Then, in STEP 23, in the controller 81 of the control unit 80, the difference Fs–Fc between the measured flow rate Fs of the raw material gas of the MFC 72 and the measured flow rate Fc of the carrier gas of the MFM 53 is computed and compared with a predetermined set value. For example, the set value is set based on the vaporization efficiency k in various conditions of a film forming process intended to be performed in the film forming apparatus 100, and it may be set with a range having a certain width. At the end point of the stabilization step of STEP 3, the vaporization efficiency k is expected to converge to a constant value, and the difference Fs–Fc also reaches an almost constant value. Therefore, if the difference Fs–Fc is in the range of the set value, a proper pickup amount is maintained. However, during the film forming step of STEP 4, if the vaporization efficiency k is changed due to some factors, the difference Fs–Fc also changes. In this case, it is impossible to perform a stable CVD process, whereby a film forming failure is caused.

Therefore, if it is determined that the difference Fs–Fc is out of the range of the set value ("YES") in STEP 23, it means that the vaporization efficiency k is changed beyond the allowable range. Accordingly, in STEP 24, the controller 81 of the control unit 80 instructs to terminate the processing in the film forming step of STEP 4. Specifically, control signals for opening/closing valves are transmitted from the control unit 80, and the valve 74 of the raw material gas supply pipe 71 is changed from an open state to a close state, and the valve 76 of the exhaust bypass pipe 75 is changed from the close state to the open state, respectively. Thereafter, the termination of the process is informed to a process manager by a method such as alarm or displaying on a monitor. As such, in the film forming method of the present embodiment, the difference Fs–Fc may be monitored during the film forming step of STEP 4, and, if the change of the vaporization efficiency k is beyond the allowable limit, the film forming processing may be stopped, thereby preventing the occurrence of the film forming failure.

Further, if it is determined that the difference Fs–Fc is not out of the predetermined range of the set value ("NO") in STEP 23, the process returns to STEP 21, and the controller 81 of the control unit 80 refers to the measured flow rate Fs of the raw material gas of the MFC 72. Then, the controller 81 of the control unit 80 refers to the measured flow rate Fc of the carrier gas of the MFM 53 in STEP 22. Thus, the measured flow rates Fs and Fc are obtained as new numerical data. Thereafter, while the film forming processing based on predetermined recipes continues, the processing from STEP 21 to STEP 23 is repeated in a predetermined time interval until the film forming step of STEP 4 terminates, and a change in the difference Fs–Fc is monitored.

Further, in the present embodiment, instead of using the measured flow rate Fs of the raw material gas at the MFC 72, a set flow rate Fs' of the raw material gas at the MFC 72 may be used. In this case, if it is determined that the difference Fs'–Fc is not out of the predetermined range of the set value ("NO") in STEP 23, the process only need to return to STEP 22 and refer to the measured flow rate Fc of the carrier gas of the MFM 53 on and after the second time of the repetitions, since the set flow rate Fs' of the raw material gas of the MFC 72 obtained in STEP 21 is a fixed value.

<Modification>

Figure 9:
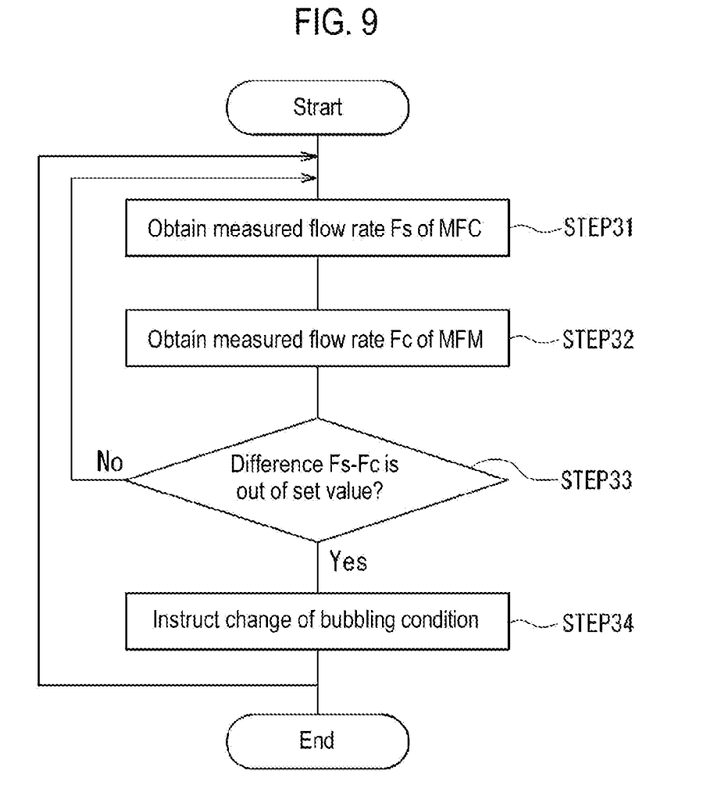
FIG. 9 is a flowchart showing an example of the procedure of a film forming method according to a modification of a third embodiment of the present disclosure.

Next, a modification of the film forming method of the third embodiment will be described with reference to FIG. 9. FIG. 9 is a flowchart showing the modification of the film forming method according to the third embodiment. In the present modification, STEP 31 corresponds to STEP 21 described above, STEP 32 corresponds to STEP 22 described above, and STEP 33 corresponds to STEP 23 described above, and the descriptions thereof are omitted since the substances are the same (see FIG. 8).

In the example shown in FIG. 8, if it is determined that the difference Fs–Fc (or the difference Fs'–Fc) is out of the range of the set value ("YES") in STEP 23, it means that the vaporization efficiency k is changed beyond the allowable range. Accordingly, in STEP 24, the controller 81 of the control unit 80 instructs to terminate the processing in the film forming step of STEP 4. In the present modification, if it is determined that the difference Fs–Fc (or the difference Fs'–Fc) is out of the range of the set value ("YES") in STEP 33, the controller 81 of the control unit 80 instructs to change a bubbling condition in the film forming step of STEP 4 in STEP 34. The bubbling condition is a condition related to the vaporization efficiency k among the film forming conditions, and it means the pressure inside the raw material container 60, the flow rate of the carrier gas, the supply flow rate of the raw material gas, the temperature of the raw material container 60 and the like during the film forming step of STEP 4. Even though the difference Fs–Fc (or the difference Fs'–Fc) is out of the range of the set value ("YES") in STEP 33, sometimes, it may not cause the film forming failure immediately. For this reason, in the present modification, the film forming step of STEP 4 is not terminated, but may be continued by changing the bubbling condition to correct the vaporization efficiency k appropriately. For example, the pressure inside the raw material container 60, the flow rate of the carrier gas, and the supply flow rate of the raw material gas can be adjusted by changing the setting of the PCV 54 and the MFC 72. Further, the temperature of the raw material container 60 can be adjusted by the temperature adjusting apparatus 61.

When the bubbling condition is changed in STEP 34, the process returns to STEP 31 describe above, and the processing from STEP 31 to STEP 33 is repeated to monitor difference Fs–Fc (or the difference Fs'–Fc), while the film forming step of STEP 4 continues.

As described above, according to the film forming method of the third embodiment, the time taken until the pickup amount Δf (in other words, the vaporization efficiency k) of the raw material from the raw material container 60 is stabilized may be reduced by performing the processing of STEP 1 to STEP 4 described above, thereby improving the throughput of the film forming process. Further, as shown in FIG. 8 or FIG. 9, the difference Fs–Fc is monitored, and, when the vaporization efficiency k is considerably changed during the film forming step of STEP 4, the processing may be stopped or the bubbling condition may be changed, thereby preventing the occurrence of the film forming failure. Therefore, it is possible to improve the reliability of the film forming process performed by the film forming apparatus 100.

Other configurations and effects of the present embodiment are the same as those of the first embodiment and the second embodiment.

[Fourth Embodiment]

The film forming method of the present embodiment is a combination of the second embodiment and the third embodiment. In other words, in the present embodiment, the film forming processing is performed basically according to the procedure of STEP1 to STEP4 described above. However, in the stabilization step of STEP 3 and the film forming step of STEP 4, the film forming processing is performed while the difference Fs−Fc is being monitored by the control unit 80. Through STEP 3 and STEP 4, the difference Fs−Fc is monitored by the control unit 80, thereby making it possible to detect the end point of STEP 3 in the stabilization step of STEP 3 and concurrently to determine whether to continue the processing or not or change the bubbling condition in the film forming step of STEP 4. For example, during the stabilization step of STEP 3, in the controller 81 of the control unit 80, the difference Fs−Fc between the measured flow rate Fs of the raw material gas of the MFC 72 and the measured flow rate Fc of the carrier gas of the MFM 53 is computed and compared with a predetermined set value. Further, during the film forming step of STEP 4, the difference Fs−Fc between the measured flow rate Fs of the raw material gas of the MFC 72 and the measured flow rate Fc of the carrier gas of the MFM 53 is monitored by the control unit 80 and compared with a predetermined set value. Further, similar to the second embodiment and the third embodiment, instead of using the measured flow rate Fs of the raw material gas at the MFC 72, a set flow rate Fs' of the raw material gas at the MFC 72 may be used in the present embodiment.

According to the film forming method of the present embodiment, the time taken until the pickup amount Δf (in other words, the vaporization efficiency k) of the raw material from the raw material container 60 is stabilized may be reduced by performing the processing of STEP 1 to STEP 4 described above, thereby improving the throughput of the film forming process. Further, in STEP 3, the end point of STEP 3 may be detected by monitoring the difference Fs−Fc (or the difference Fs'−Fc), thus minimizing the process time of STEP 3. Further, when the vaporization efficiency k is not stabilized, the transition to STEP 4 may be stopped, thus preventing the occurrence of the film forming failure. Further, in STEP 4, by monitoring the difference Fs−Fc (or the difference Fs'−Fc), when the vaporization efficiency k is considerably changed during the film forming step of STEP 4, the processing may be terminated or the bubbling condition may be changed, thus preventing the occurrence of the film forming failure. Therefore, it is possible to improve the reliability of the film forming process performed by the film forming apparatus 100.

In the foregoing, the embodiments of the present disclosure have been described. However, the present disclosure is not limited to the above embodiments, and various modifications are possible. For example, in the above embodiments, the semiconductor wafer has been described as an example of the substrate to be processed. However, the substrate to be processed may also include, but is not limited to, for example, a glass substrate, an LCD substrate, a ceramic substrate, or the like. Further, although an example of the film forming apparatus 100 conducting the thermal CVD process has been described in the above-described embodiments, the present disclosure may also be applied to, for example, the plasma CVD process or the ALD process.

Further, in the above-described embodiments, the pressure inside the raw material container 60 is adjusted by the PCV 54. However, instead of the PCV 54, a flow rate control apparatus such as the MFC may be provided in the carrier gas supply pipe 52, and, by using the flow rate control apparatus, a feedback control may be performed based on measured values of the pressure gauge 55 provided inside the raw material container 60. In this case, the flow rate control apparatus such as the MFC provided in the carrier gas supply pipe 52 and the pressure gauge 55 constitute a pressure adjusting means.

This international application claims priority to Japanese Patent Application No. 2012-150263 filed on Jul. 4, 2012, the entire disclosures of which are incorporated herein by reference.

What is claimed is:

1. A film forming method conducted by using a film forming apparatus comprising:
   a processing container capable of being vacuumized;
   a mounting table, on which an object to be processed is mounted, provided in the processing container;
   an exhaust device configured to depressurize and exhaust an inside of the processing container;
   a raw material container having a gas inlet and a gas outlet, in which a film forming raw material vaporizable by a carrier gas is accommodated;
   a carrier gas supply unit configured to supply the carrier gas into the raw material container;
   a carrier gas supply path configured to connect the carrier gas supply unit and the raw material container, and supply the carrier gas into the raw material container;
   a raw material gas supply path configured to connect the raw material container and the processing container, and supply a raw material gas into the processing container;
   an exhaust bypass path branched from the raw material gas supply path and connected to the exhaust device without passing through the processing container; and
   a pressure adjusting means configured to adjust a pressure inside the raw material container,
   wherein the method comprises:
   increasing a pressure inside the raw material container accommodating the film forming raw material to a first pressure $P_1$ by supplying the carrier gas into the raw material container and vaporizing the film forming raw material into the raw material gas using the pressure adjusting means, in a state where the gas outlet of the raw material container is closed;
   decreasing the pressure inside the raw material container accommodating the film forming raw material to a second pressure $P_2$ by discarding the raw material gas inside the raw material container via the exhaust bypass path, in a state where the gas outlet is opened and an introduction of the carrier gas into the raw material container is blocked;
   stabilizing a vaporization efficiency of the raw material inside the raw material container while introducing the carrier gas into the raw material container and concurrently discarding the raw material gas from the raw material container via the exhaust bypass path, wherein the vaporization efficiency is in a range of 30% to 60%; and
   forming a film by depositing a thin film on an object to be processed using a chemical vapor deposition (CVD)

method by supplying the raw material gas into the processing container via the raw material gas supply path.

2. The method of claim 1, wherein the film forming apparatus further comprises:
a mass flow meter;
a pressure control valve as the pressure adjusting means; and
a plurality of valves in the carrier gas supply path,
wherein a mass flow controller and a plurality of valves are provided in the raw material gas supply path, and
wherein, in increasing the pressure inside the raw material container to a first pressure $P_1$, the carrier gas is supplied into the raw material container by the pressure control valve, and, in decreasing the pressure inside the raw material container to a second pressure $P_2$, the raw material gas inside the raw material container is discarded while being adjusted in a flow rate by the mass flow controller.

3. The method of claim 1, wherein the film forming apparatus further comprises:
a mass flow meter; and
a mass flow controller,
wherein, in stabilizing the vaporization efficiency of the raw material inside the raw material container, a timing of a transition from stabilizing the vaporization efficiency of the raw material inside the raw material container to forming the film is determined by monitoring a difference Fs-Fc between a measured flow rate Fs of the raw material gas in the mass flow controller and a measured flow rate Fc of the carrier gas in the mass flow meter.

4. The method of claim 1, wherein the film forming apparatus further comprises:
a mass flow meter; and
a mass flow controller,
wherein, in forming the film, forming the film is continued or stopped, or vaporization conditions of a raw material is changed by monitoring a difference Fs-Fc between a measured flow rate Fs of the raw material gas in the mass flow controller and a measured flow rate Fc of the carrier gas in the mass flow meter.

5. The method of claim 1, wherein, after forming the film is terminated for a certain object to be processed, while the processing container is in a standby state until a next object to be processed is processed, increasing a pressure inside the raw material container is performed to repeatedly perform a film forming processing on a plurality of objects to be processed.

6. The method of claim 1, wherein, if a partial pressure Ps of the raw material inside the raw material container in forming the film is in a range of 266 Pa to 400 Pa, a first pressure $P_1$ inside the raw material container when a pressure is increased in increasing the pressure is in a range of 21331 Pa to 31997 Pa.

\* \* \* \* \*